(12) United States Patent
Yi

(10) Patent No.: US 11,238,335 B2
(45) Date of Patent: Feb. 1, 2022

(54) ACTIVE MEMRISTOR BASED SPIKING NEUROMORPHIC CIRCUIT FOR MOTION DETECTION

(71) Applicant: HRL Laboratories, LLC, Malibu, CA (US)

(72) Inventor: Wei Yi, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 77 days.

(21) Appl. No.: 16/793,387

(22) Filed: Feb. 18, 2020

(65) Prior Publication Data
US 2020/0342299 A1    Oct. 29, 2020

Related U.S. Application Data

(60) Provisional application No. 62/838,671, filed on Apr. 25, 2019.

(51) Int. Cl.
| G11C 13/00 | (2006.01) |
| G06N 3/063 | (2006.01) |
| H01L 43/08 | (2006.01) |
| G06N 3/04 | (2006.01) |

(52) U.S. Cl.
CPC .......... *G06N 3/0635* (2013.01); *G06N 3/049* (2013.01); *H01L 43/08* (2013.01)

(58) Field of Classification Search
CPC .......... G06N 3/049; G06N 3/063; G06N 3/02; G06N 3/088; G11C 13/00; G11C 13/004; G11C 13/0026
See application file for complete search history.

(56) References Cited

U.S. PATENT DOCUMENTS

| 5,998,780 A * | 12/1999 | Kramer | G01S 11/12 |
| | | | 250/221 |
| 8,669,785 B2 | 3/2014 | Pickett | |
| 2014/0035614 A1* | 2/2014 | Pickett | G06N 3/049 |
| | | | 326/30 |
| 2015/0088797 A1 | 3/2015 | Kim et al. | |
| 2015/0100531 A1 | 4/2015 | Hall et al. | |
| 2015/0379395 A1* | 12/2015 | Pickett | G06N 3/0635 |
| | | | 706/27 |

FOREIGN PATENT DOCUMENTS

KR    20150034900 A    4/2015

OTHER PUBLICATIONS

Ruye Wang, "Neural circuits in the retina I, R-H-B circuits" URL: http://fourier.eng.hmc.edu/e180/lectures/retina/node6.html (1999).

(Continued)

*Primary Examiner* — Hien N Nguyen
(74) *Attorney, Agent, or Firm* — Ladas & Parry

(57) ABSTRACT

A motion-sensing circuit for determining a direction of motion and a velocity of an object includes a first photo-receptor for sensing the object, an excitatory active memristor neuron circuit coupled to the first photo-receptor, a second photo-receptor for sensing the object, an inhibitory active memristor neuron circuit coupled to the second photo-receptor, and a self-excitatory active memristor output-counter neuron circuit coupled to the excitatory active memristor neuron circuit and coupled to the inhibitory active memristor neuron circuit.

32 Claims, 12 Drawing Sheets

(56) References Cited

OTHER PUBLICATIONS

Ruye Wang, "Books and References" URL: http://fourier.eng.hmc.edu/e180/lectures/introduction/node2.html (2000).
H. B. Barlow and W. R. Levick, "The mechanism of directionally selective units in rabbit's retina." The Journal of Physiology, 178, 477-504 (1965).
S. I. Fried, T. A. Munch, and F. S. Werblin, "Mechanisms and circuitry underlying directional selectivity in the retina." Nature, 420, 411-414 (2002).
R. G. Benson and T. Belbruck, "Direction selective silicon retina that uses null inhibition." In NIPS (Neural Information Processing Systems) (Denver, CO), 756-763 (1991).
J. Kramer, R. Sarpeshkar, and C. Koch, "Pulse-based analog VLSI velocity sensors." IEEE. Trans. Circ. Sys. II 86-101 (1997).
M. D. Pickett, G. Medeiros-Ribeiro and R. S. Williams, "A scalable neuristor built with Mott memristors." Nat. Mater. 12 114-117 (2013).
G. Haessig, A. Cassidy, R. Alvarez, R. Benosman, and G. Orchard, "Spiking optical flow for event-based sensors using IBM's TrueNorth neurosynaptic system." arXiv: 1710.09820v1 (2017).
U.S. Appl. No. 15/976,687, filed May 10, 2018, Wei Yi.
U.S. Appl. No. 15/417,049, filed Jan. 26, 2017, Wei Yi.
International Preliminary Report on Patentability mailed with respect to International Application No. PCT/US2020/018689 dated Mar. 31, 2021.
International Search Report and Written Opinion of the International Searching Authority from PCT/US2020/018689, dated Jun. 5, 2020.
Orchard, Garrick et al., "Bioinspired Visual Motion Estimation", arXiv:1511.00096v1, Oct. 31, 2015.
Pizzo, David Alejandro Trejo, "Resistive communications based on neuristors", aiXiv:1705.03008v1, May 7, 2017.
Ebong, Idongesit et al., "Memristor based STDP learning network for position detection", $22^{nd}$ International Conference on Microelectronics (ICW 2010), Dec. 22, 2010.
Ebong, Idongesit et al., "CMOS and Memristor-Based Neural Network Design for Position Detection", Proceedings of the IEEE, vol. 100, No. 6, Jun. 2012.

\* cited by examiner

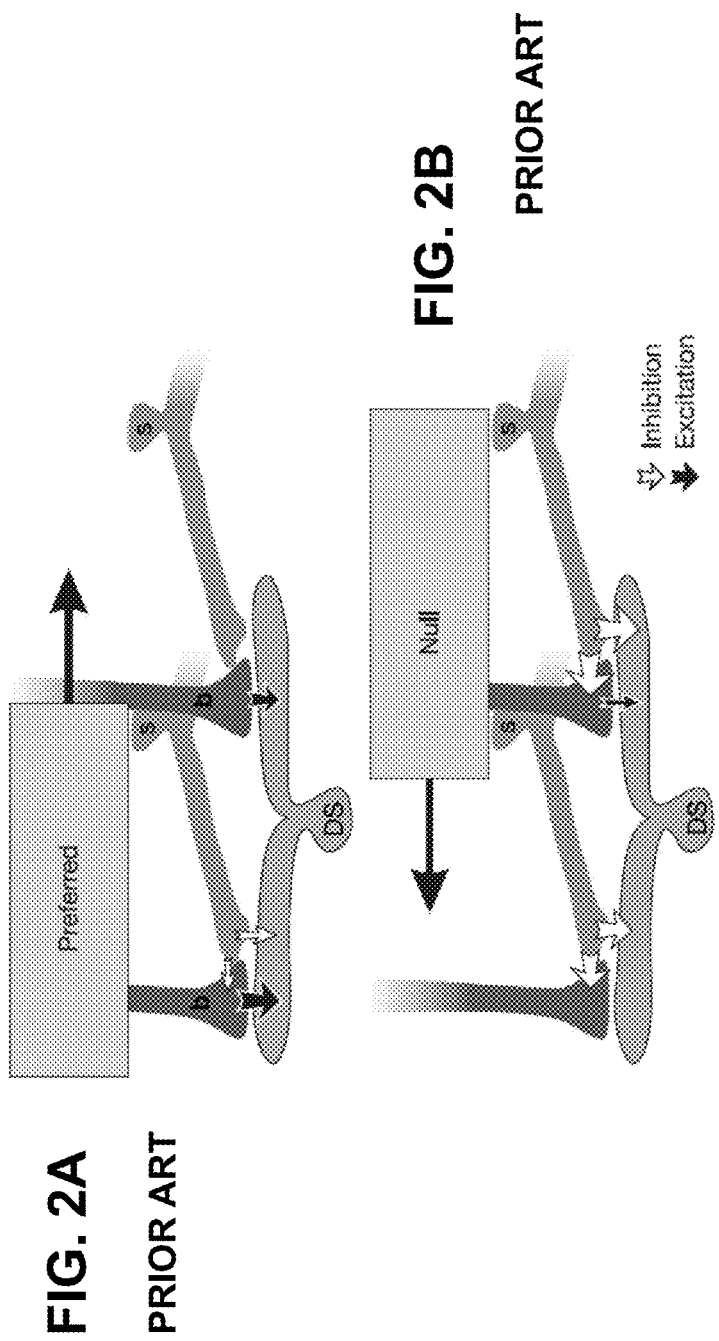

In both (b) & (c): M outputs only if P1 precedes P2

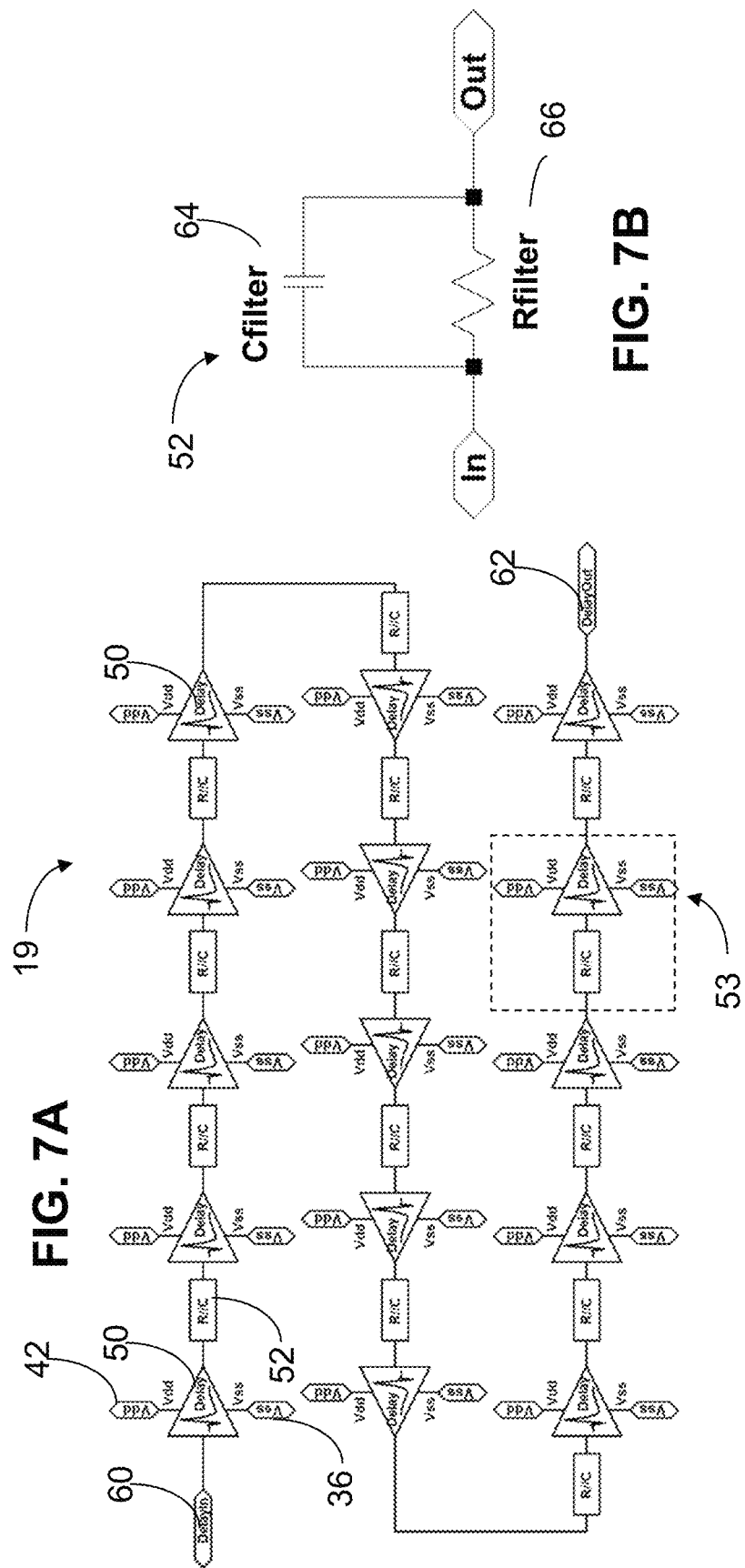

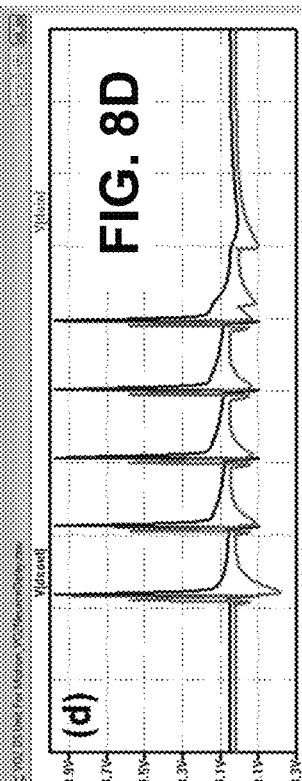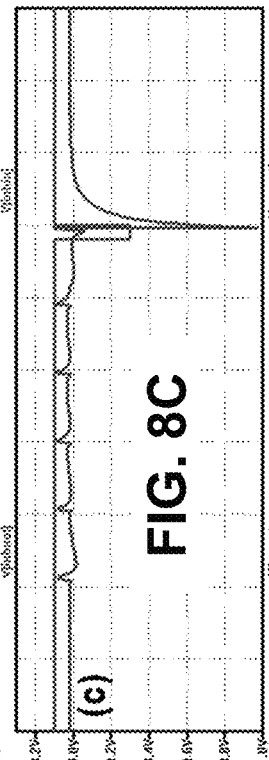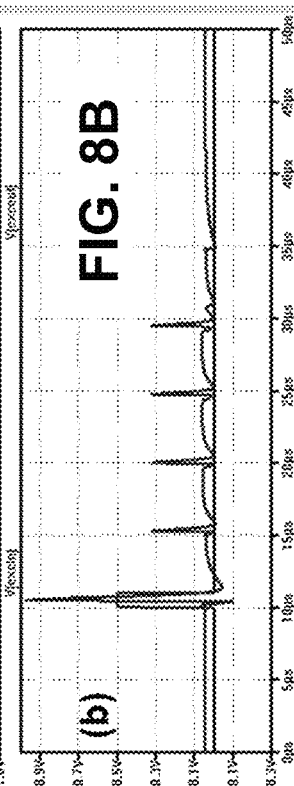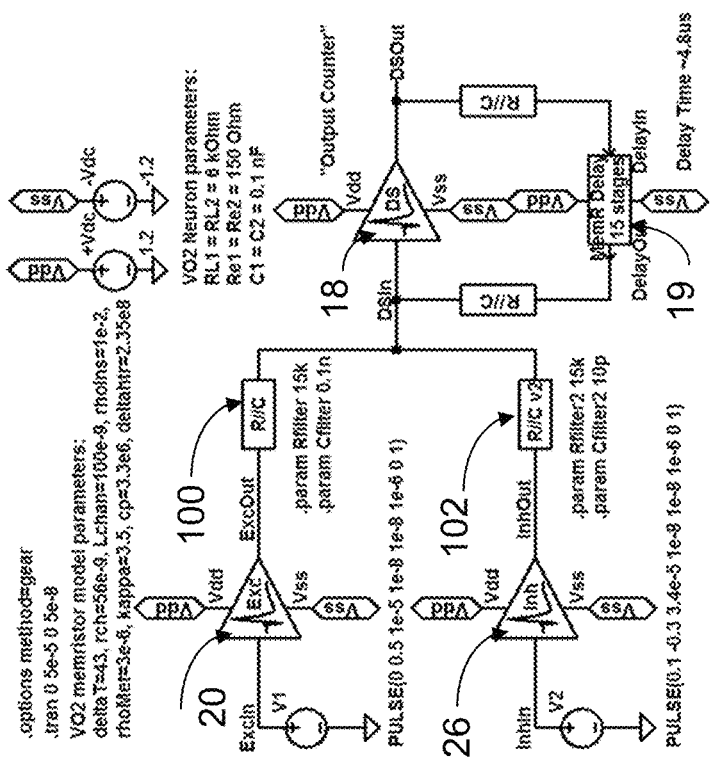

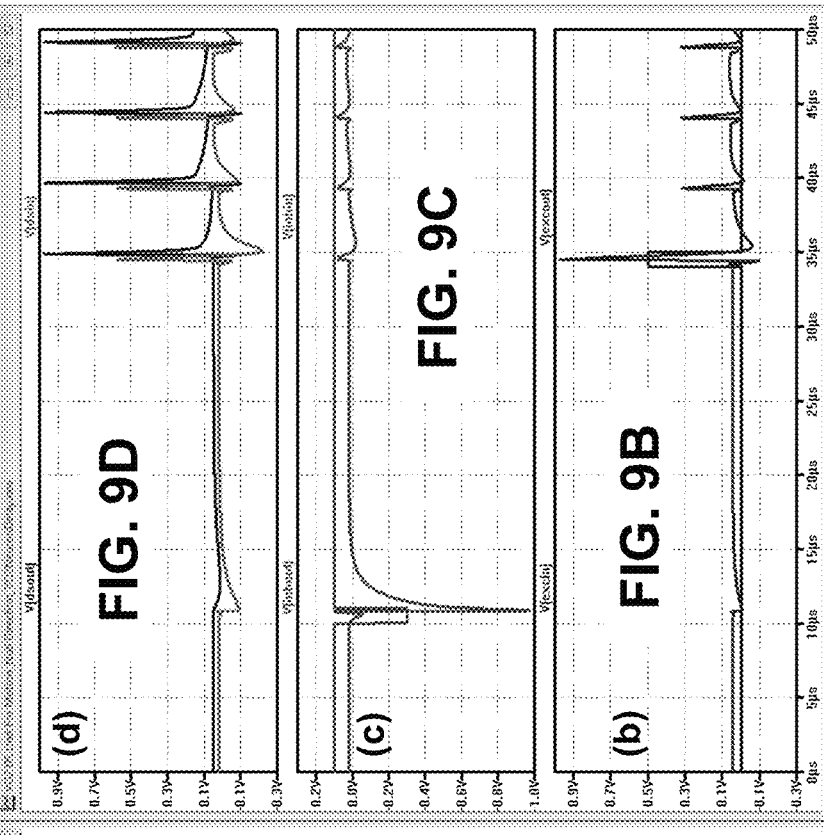

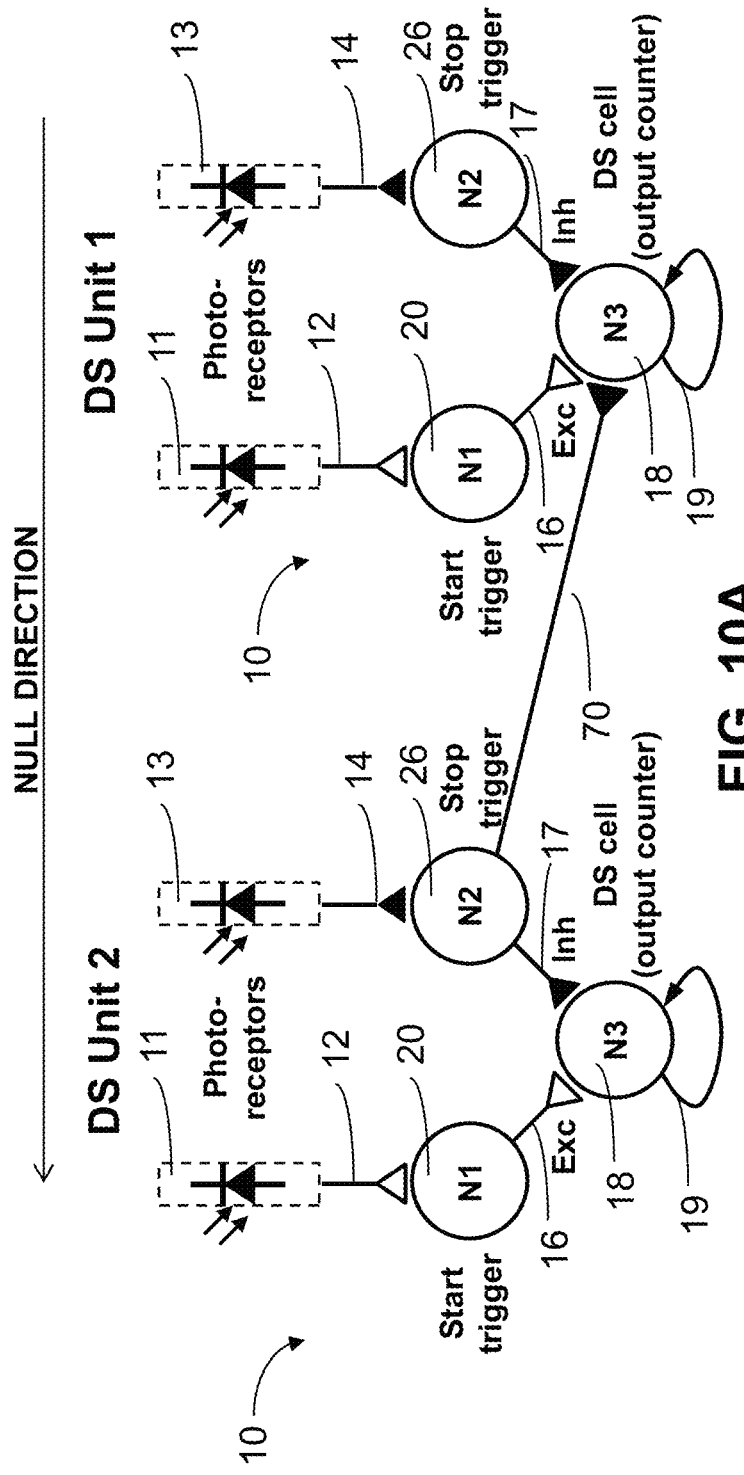
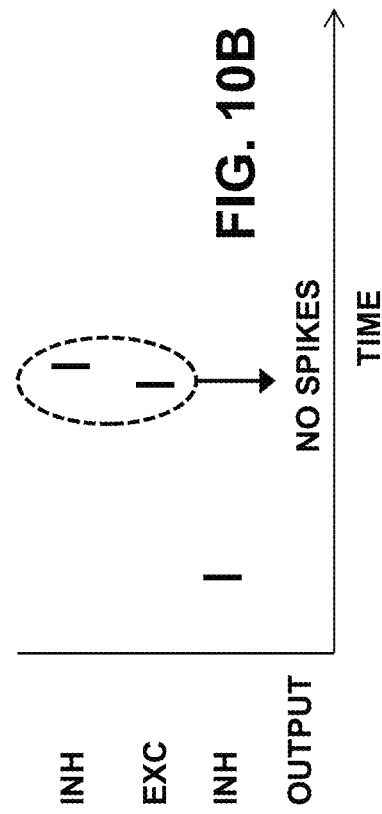
FIG. 10A
FIG. 10B

ACTIVE MEMRISTOR BASED SPIKING NEUROMORPHIC CIRCUIT FOR MOTION DETECTION

CROSS REFERENCE TO RELATED APPLICATIONS

This application is related to and claims priority from U.S. Provisional Application Ser. No. 62/838,671, filed Apr. 25, 2019, and is related to U.S. patent application Ser. No. 15/976,687, filed May 10, 2018, which are incorporated by reference herein as though set forth in full.

STATEMENT REGARDING FEDERAL FUNDING

None

TECHNICAL FIELD

This disclosure relates to neural networks.

BACKGROUND

In an animal's retina, as shown in FIG. 1, directionally selective (DS) ganglion cells respond strongly to movement in their preferred direction, but show minimal response to movement in the opposite (null) direction.

FIG. 1 shows a functional neural circuit model of an animal's retina. Bipolar cells receive inputs directly from the photoreceptors (cones and rods). Horizontal cells receive inputs from the photoreceptors over a much larger area of retina than the bipolar cells. Amacrine interneuron cells receive information from and send information to bipolar and other amacrine cells, and send information to ganglion cells. Ganglion cells send information to the central nervous system. This is further described in References [1] and [2] below, which are incorporated herein by reference.

A milestone in discovering the retina's mechanism for directional sensitive motion detection was achieved by H. B. Barlow and W. R. Levick's modeling of a rabbit's retina, as described in Reference [3] below, which is incorporated herein by reference. Similar motion detection mechanisms were found in other animals as well. They found that directional sensitivity in rabbit's retinal ganglion cells is not caused by progressive changes in the receptive field, instead the mechanism works by discriminating the sequence of individual pairs of regions, based on a lateral inhibitory mechanism that vetoes the response to a null direction.

The mechanisms and circuitry underlying the directionally sensitive neural computation have remained controversial. A more recent study of this topic can be found by the work by S. I. Fried, T. A. Munch, and F. S. Werblin described in Reference [4] below, which is incorporated herein by reference. FIGS. 2A and 2B show a possible mechanism and circuitry underlying the directionally sensitive (DS) retinal ganglion cells in animal's retina. Cells shown conceptually are: bipolar cells ('b', red) which are excited by photoreceptors from above (not shown) and pass the response to directionally sensitive (DS) ganglion cells below ('DS', grey); starburst amacrine cells ('s', blue), a type of presynaptic interneuron that delivers direct inhibition to DS cells.

S. I. Fried, T. A. Münch, and F. S. Werblin explain the lateral inhibition by a type of presynaptic interneuron called the starburst amacrine cell, which delivers stronger inhibitory input to DS ganglion cells for movement in the null direction than for movement in the preferred direction, as illustrated by FIG. 4 of Ref. [4], which is copied here as FIGS. 2A and 2B.

In neuromorphic engineering, these (still-controversial) details in neurophysiology are not essential, as one can design simplified analog circuits to realize similar functions. An early example is the circuit proposed by R. G. Benson and T. Belbrück, described in Reference [5] below, which is incorporated herein by reference. A simplified neural network diagram based on the Barlow and Levick model of lateral inhibition, as described in Reference [3], and a CMOS implementation are illustrated in FIGS. 1 and 2 of Reference [5], which are copied herein as FIGS. 3A and 3B. However, as further described below the CMOS implementation lacks the benefits of scalability and low power of the active-memristor implementation of the present disclosure.

Later, J. Kramer, R. Sarpeshkar, and C. Koch, in Reference [6] below, which is incorporated herein by reference, proposed two algorithms and CMOS circuit implementations to realize direction and velocity detection of motions.

FIG. 4A shows a schematic diagram of the CMOS motion sensing circuit having three processing stages, FIG. 4B shows voltage pulses in a first algorithm "FT" (facilitate-and-trigger), and FIG. 4C shows voltage signals in a second algorithm "FS" (facilitate-and-sample) in accordance with Reference [6]. FIGS. 4A, 4B and 4C are copied from FIG. 1 of Reference [6].

The CMOS motion sensing circuit of Reference [6] has three processing stages as shown in FIG. 4A. The 1st stage temporal edge detectors (E) generate current pulses in response to fast brightness transients. The 2nd stage pulse-shaping circuits (P) convert the current pulses into voltage pulses. The 3rd stage has direction-sensitive motion circuits (M). Each motion circuit responds to velocity in one direction of motion only. In the first algorithm "FT" (facilitate-and-trigger), as shown in FIG. 4B, the width of the output pulse of the motion circuit equals the overlap time of the facilitation pulse P1 and the trigger pulse P2. If P2 precedes P1, no output pulse is generated. In the second algorithm "FS" (facilitate-and-sample), as shown in FIG. 4C, the output of the motion circuit equals the voltage of the slowly decaying facilitating pulse P1 at the time of arrival of the thin sampling pulse P2. The output is low if P2 precedes P1.

The main drawback in the approaches described by Kramer et al. in Reference [6] is the high energy consumption. The FT algorithm relies on energy-hungry square pulses for velocity estimation. The FS algorithm is better in that sense but the slowly decaying facilitation pulse is still not energy friendly. The CMOS circuits involved in their design (see FIGS. 2, 3, 4 in Reference [6]) are relatively simple, so the scalability is not as much of a concern.

REFERENCES

The following references are incorporated herein as though set forth in full.

[1] http://fourier.eng.hmc.edu/e180/lectures/retina/node6.html

[2] http://fourier.eng.hmc.edu/e180/lectures/introduction/node2.html)

[3] H. B. Barlow and W. R. Levick, "The mechanism of directionally selective units in rabbit's retina." The Journal of Physiology, 178, 477-504 (1965)

[4] S. I. Fried, T. A. Münch, and F. S. Werblin, "Mechanisms and circuitry underlying directional selectivity in the retina." Nature, 420, 411-414 (2002)

[5] R. G. Benson and T. Belbrück, "Direction selective silicon retina that uses null inhibition." In NIPS (Neural Information Processing Systems) (Denver, Colo.), 756-763 (1991).

[6] J. Kramer, R. Sarpeshkar, and C. Koch, "Pulse-based analog VLSI velocity sensors." IEEE. Trans. Circ. Sys. II 86-101 (1997).

[7] U.S. patent application Ser. No. 15/976,687, filed May 10, 2018.

[8] U.S. patent application Ser. No. 15/417,049, filed Jan. 26, 2017.

[9] M. D. Pickett, G. Medeiros-Ribeiro and R. S. Williams, A scalable neuristor built with Mott memristors. Nature Mater. 12, 114 (2013).

[10] M. D. Pickett, Logic circuits using Neuristors. U.S. Pat. No. 8,669,785 B2 (2014).

[11] G. Haessig, A. Cassidy, R. Alvarez, R. Benosman, and G. Orchard, "Spiking optical flow for event-based sensors using IBM's TrueNorth neurosynaptic system." arXiv: 1710.09820v1 (2017).

What is needed is circuit that detects the direction and velocity of a moving object in a similar manner to directionally sensitive (DS) ganglion cells in an animal retina that has a reduced device count and is more energy efficient and scalable than prior art approaches. Also needed is a circuit that offers energy-efficient, accurate, and real-time optical flow estimation for navigation, obstacle avoidance, distance regulation, and moving target tracking. The embodiments of the present disclosure answer these and other needs.

SUMMARY

In a first embodiment disclosed herein, a motion-sensing circuit for determining a direction of motion and a velocity of an object comprises a first photo-receptor for sensing the object, an excitatory active memristor neuron circuit coupled to the first photo-receptor, a second photo-receptor for sensing the object, an inhibitory active memristor neuron circuit coupled to the second photo-receptor, and a self-excitatory active memristor output neuron circuit coupled to the excitatory active memristor neuron circuit and coupled to the inhibitory active memristor neuron circuit.

In another embodiment disclosed herein, a method for determining a direction of motion and a velocity of an object comprises providing a first photo-receptor for sensing the object, providing an excitatory active memristor neuron circuit coupled to the first photo-receptor, providing a second photo-receptor for sensing the object, providing an inhibitory active memristor neuron circuit coupled to the second photo-receptor, providing a self-excitatory active memristor output neuron circuit coupled to the excitatory active memristor neuron circuit and coupled to the inhibitory active memristor neuron circuit, sending an excitatory pulse from the excitatory active memristor output neuron circuit to the self-excitatory active memristor output neuron circuit if the first photo-receptor senses the object, wherein the self-excitatory active memristor output neuron circuit outputs pulses at a periodic rate upon receiving the excitatory pulse, and sending an inhibitory pulse from the inhibitory active memristor neuron circuit to the self-excitatory active memristor output neuron circuit if the second photo-receptor senses the object, wherein the self-excitatory active memristor output neuron circuit ceases to output pulses upon receiving the inhibitory pulse.

In yet another embodiment disclosed herein, a motion-sensing circuit for determining a two dimensional direction of motion and velocity of an object comprises a first photo-receptor for sensing the object located in a center position, a second photo-receptor for sensing the object located above the first photo-receptor, a third photo-receptor for sensing the object located below the first photo-receptor, a fourth photo-receptor for sensing the object located to a left of the first photo-receptor, a fifth photo-receptor for sensing the object to a right of the first photo-receptor, a first direction sensitive device located above the second photo-receptor and coupled to the first photo-receptor and the second photo-receptor, a second direction sensitive device located below the third photo-receptor and coupled to the first photo-receptor and the third photo-receptor, a third direction sensitive device located to the left of the fourth photo-receptor and coupled to the first photo-receptor and the fourth photo-receptor; and a fourth direction sensitive device located to the right of the fifth photo-receptor and coupled to the first photo-receptor and the fifth photo-receptor, wherein the first, second, third and fourth direction sensitive devices each comprise an excitatory active memristor neuron circuit, an inhibitory active memristor neuron circuit, and a self-excitatory active memristor output neuron circuit coupled to the excitatory active memristor neuron circuit and coupled to the inhibitory active memristor neuron circuit.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 2A and 2B show a possible mechanism and circuitry underlying the directionally sensitive retinal ganglion cells in animal's retina in accordance with the prior art.

FIG. 7A shows a circuit diagram of a delay feedback circuit having 15 stages of excitatory active memristor neurons. It is used to provide a delayed feedback from the output of the self-excitatory active memristor DS cell output-counter neuron (N3) shown in FIGS. 5A and 5B to its input for generating a self-sustained train of spikes. FIG. 7B shows a circuit diagram for the resistor-capacitor (R//C) filter representing the synapse connection between any pair of excitatory active memristor neurons in the delay feedback circuit in FIG. 7A.

FIGS. 8A, 8B, 8C and 8D show SPICE simulation of active-memristor based spiking neuromorphic directionally sensitive (DS) unit for the case of a stimulus moving in the preferred direction. FIG. 8A shows the circuit schematic of the DS unit. FIG. 8B shows the input and output waveforms of the excitatory start trigger neuron, FIG. 8C shows input and output waveforms of the inhibitory stop trigger neuron, and FIG. 8D shows input and output waveforms (output counter) of the DS cell in accordance with the present disclosure.

FIGS. 9A, 9B, 9C and 9D show SPICE simulation of active-memristor based spiking neuromorphic directionally sensitive (DS) unit for the case of a stimulus moving in the null direction. FIG. 9A shows circuit schematic of the DS unit. FIG. 9B shows input and output waveforms of the excitatory start trigger neuron. FIG. 9C shows input and output waveforms of the inhibitory stop trigger neuron, and FIG. 9D shows input and output waveforms (output counter) of the DS cell in accordance with the present disclosure.

FIG. 10A shows a schematic functional diagram of an active-memristor based spiking neuromorphic directionally sensitive (DS) unit for the case of a stimulus moving in the null direction, and showing that the stop trigger neuron (N2) in the neighboring DS unit on the left may inhibit the spiking of the start trigger neuron (N1) in the DS unit on the right, when the stimulus moving in the null direction passes by N1 and then N2, as shown in FIG. 10B, in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes an active memristor-based spiking neuromorphic circuit that detects the direction and velocity of a moving object in a similar manner to directionally sensitive (DS) ganglion cells in an animal retina. In one embodiment, the circuit has four copies of directionally sensitive (DS) ganglion cell units arranged in four orthogonal directions (North, South, West, East) for two-dimensional (2D) motion detection. Compared with the CMOS-based prior art, the proposed memristor circuit has a smaller device count and is more energy efficient and scalable for integrated circuit applications. Together with spike (event) based vision sensors and memristor neuromorphic processors, the proposed circuit offers a unique solution for energy-efficient, accurate, and real-time optical flow estimation for a variety of applications, including but not limited to navigation, obstacle avoidance, distance regulation, and moving target tracking. Optical flow is the pattern of apparent motion of objects, surfaces, and edges in a visual scene caused by the relative motion between an observer and a scene.

The main advantage of using active-memristor based neuromorphic circuit to realize directionally sensitive artificial retina is that this is a biomimetic approach, which has several main advantages. Firstly, there is scalability advantage inherited from the ultra-compactness of the active-memristor neuron building blocks, which are described in Reference [7] U.S. patent application Ser. No. 15/976,687, filed May 10, 2018, which is incorporated herein by reference. In particular, FIGS. 3A and 3B and the description related to FIGS. 3A and 3B of U.S. patent application Ser. No. 15/976,687 describe active-memristor neuron building blocks. Further, FIGS. 3A and 3B of U.S. patent application Ser. No. 15/976,687 are the same as FIGS. 6A and 6B of the present disclosure.

Secondly, there is energy efficiency advantage. The energy consumption of the direction and velocity sensors of the present disclosure is ultralow as compared with CMOS prior arts, owing to both the ultralow spike energy of active memristor neurons and the sparse spike (event) based signal representation.

Figures 5A, 5B, 5C, 5D:
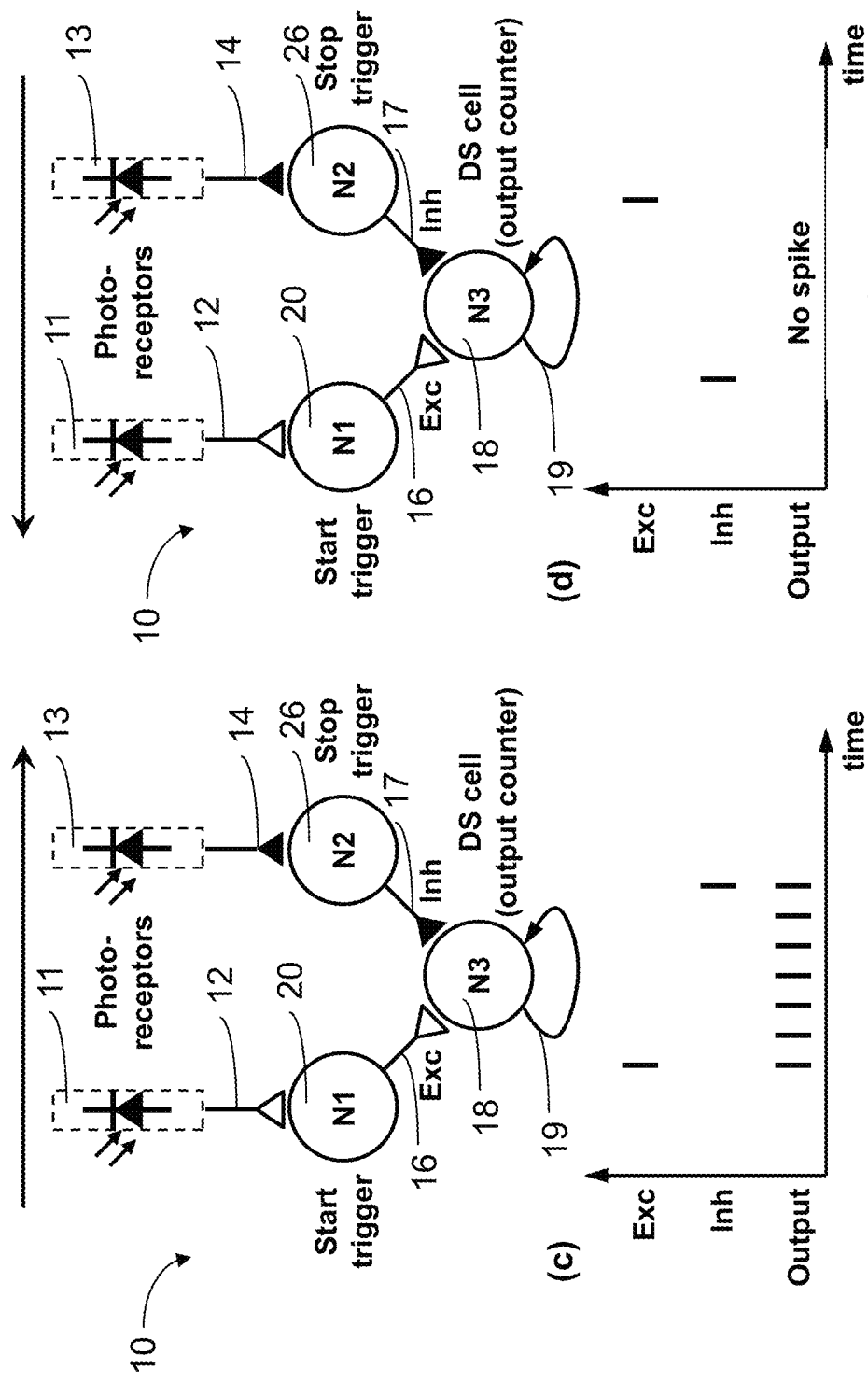
FIGS. 5A and 5B show schematic functional diagrams of an active memristor based spiking neuromorphic directionally sensitive (DS) unit. For the cases of FIG. 5A, the stimulus moves in the preferred direction. For the case of FIG. 5B, the stimulus moves in the null direction. The spike timing diagrams for the excitatory start trigger neuron (N1), inhibitory stop trigger neuron (N2), and the self-excitatory DS cell output-counter neuron (N3) are shown in FIGS. 5C and 5D for FIGS. 5A and 5B, respectively, in accordance with the present disclosure. Note that in the present disclosure DS unit refers to the whole circuit that contains 3 neurons, a start trigger N1, a stop trigger N2, and an output-counter N3, and DS cell refers to the output-counter N3. The self-excitatory DS cell output-counter neuron (N3) may also be called a "delayed autofeedback loop", which is terminology that has been used in the prior art.

FIGS. 5A, 5B, 5C and 5D show schematic functional diagrams of an active-memristor based spiking neuromorphic directionally sensitive (DS) unit for the cases of the stimulus moving in the preferred direction, as shown in FIG. 5A; and for the case of the stimulus moving in the null direction, as shown in FIG. 5B. The corresponding spike timing diagrams for FIGS. 5A and 5B are shown in FIGS. 5C and 5D, respectively.

As shown in FIG. 5A, each active memristor directionally sensitive (DS) unit 10 receives spike inputs 12 and 14 from two neighboring pixels 11 and 13 in order to mimic biological DS cells in an animal's retina. The DS unit 10 has a pair of active memristor trigger neurons mimicking bipolar cells, one excitatory start trigger neuron N1 20, and one stop trigger neuron N2 26, both of which are connected to an active memristor output-counter DS neuron N3 18. The physical positions of the start 20 and stop 26 trigger neurons determine the preferred direction for the DS unit to respond to a moving stimulus. The trigger neurons are analogous to the bipolar cells in an animal retina, and the output counter neuron is analogous to the ganglion cells in an animal retinas.

In a preferred direction, a stimulus arrives first at the photo-receptor 11 which sends an excitatory pulse signal to the input 12 of the start trigger neuron 20, which then fires an excitatory spike to the input 16 of the self-excitatory output neuron 18, causing it to fire a repetitive train of spikes at its intrinsic frequency, as shown in FIG. 5C. The output neuron 18 continues to spike until it receives an inhibitory spike at input 17 from the stop trigger neuron 26, which occurs when the stimulus arrives at the photo-receptor 13 which sends an inhibitive pulse to the stop trigger neuron 18, which in turn fires an inhibitive spike to the input 17 of the self-excitatory output neuron 18.

In a null direction, the stimulus moves in the opposite direction and arrives at the photo-receptor 13 first, which sends an inhibitive pulse signal to the input 14 of the stop trigger neuron 26, as shown in FIG. 5B. The inhibitory spike received at the input 17 from the stop trigger neuron 26 does not cause the output neuron 18 to spike. The directional sensitivity is thus used to detect the direction of motion. Moreover, the time interval between the beginning and the end of the output spiking, as shown in FIG. 5C, provides information on the velocity of the motion of the stimulus. The shorter the time interval is, the higher the velocity is.

Such a DS unit circuit has been implemented by CMOS neurons previously, as described in References [3] and [4], above. In the present disclosure, the CMOS implementation of the prior art has been replaced with active memristor spiking neural circuits 20, 26 and 18. As described herein the CMOS implementation lacks the benefits of scalability and low power of the active-memristor implementation of the present disclosure.

Figure 3A:
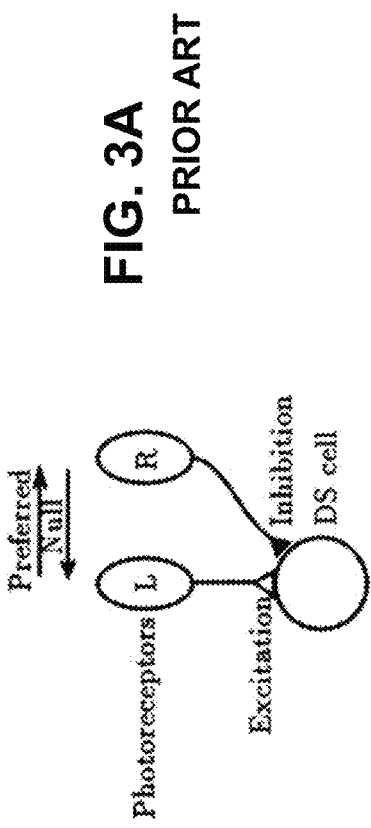
FIG. 3A shows a simplified neural network model of directional selectivity, and FIG. 3B show a possible CMOS implementation of FIG. 3A in accordance with the prior art.
Figure 3B:
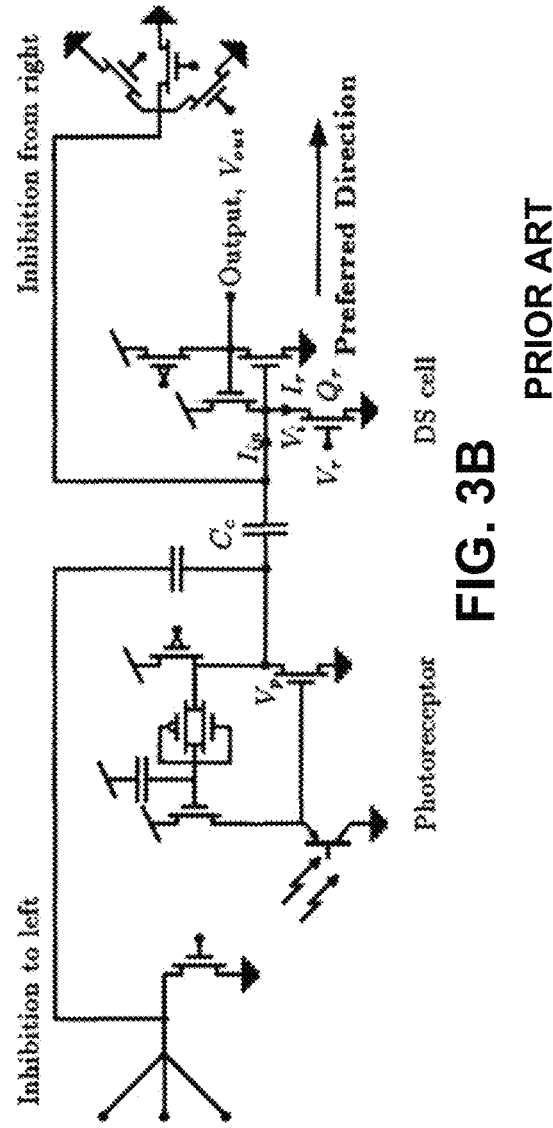
Figure 4A:
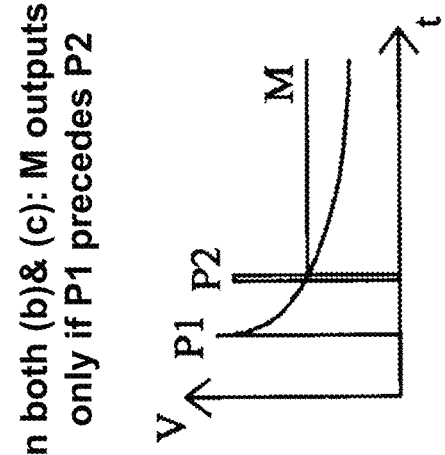
FIG. 4A shows a schematic diagram of the CMOS motion sensing circuit having three processing stages.
Figure 4B:
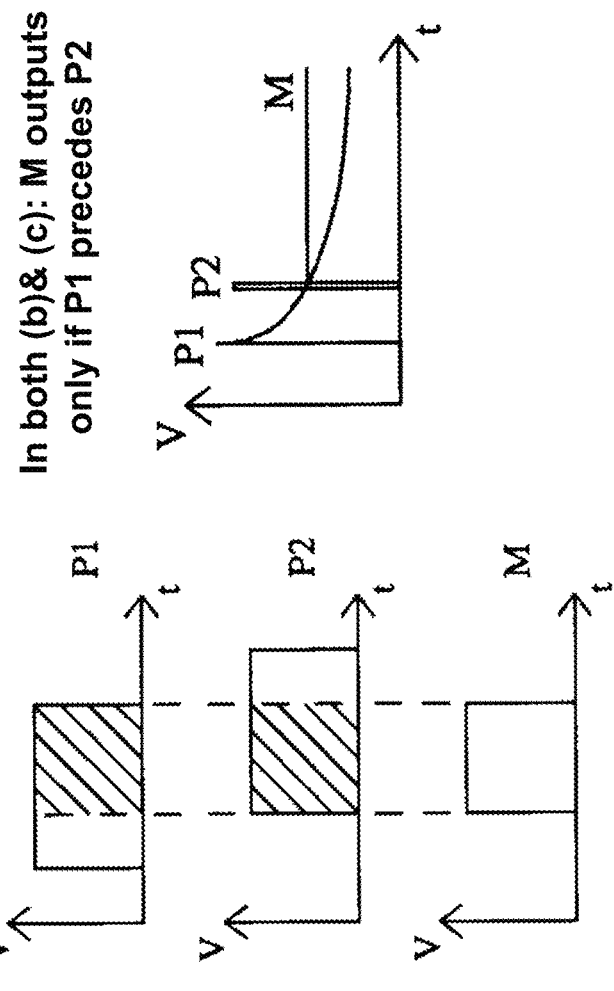
FIG. 4B shows voltage pulses in a first algorithm "FT" (facilitate-and-trigger)
Figure 4C:
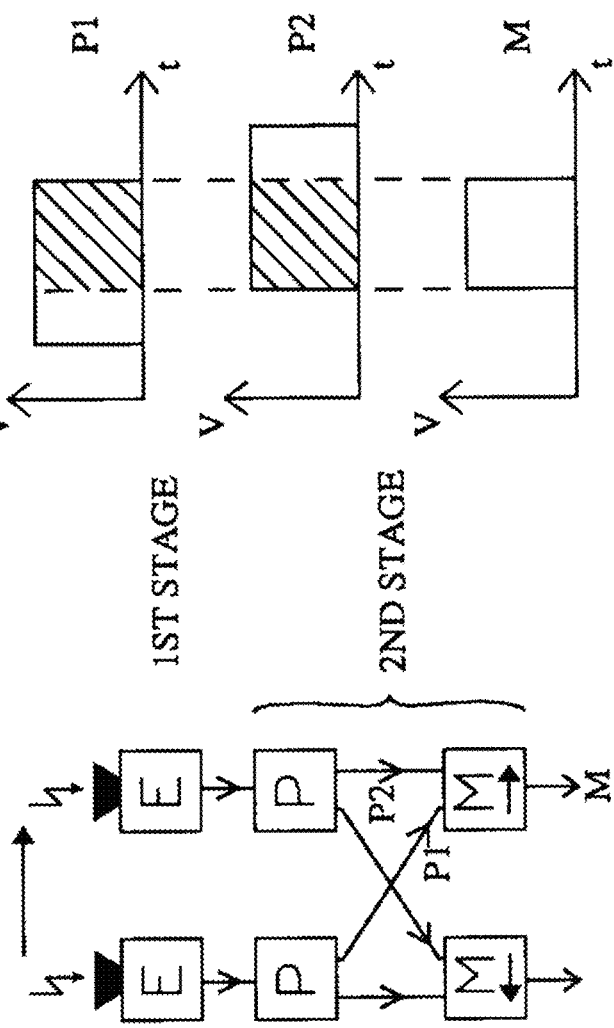
FIG. 4C shows voltage signals in a second algorithm "FS" (facilitate-and-sample) in accordance with the prior art.
Figures 6A, 6B:
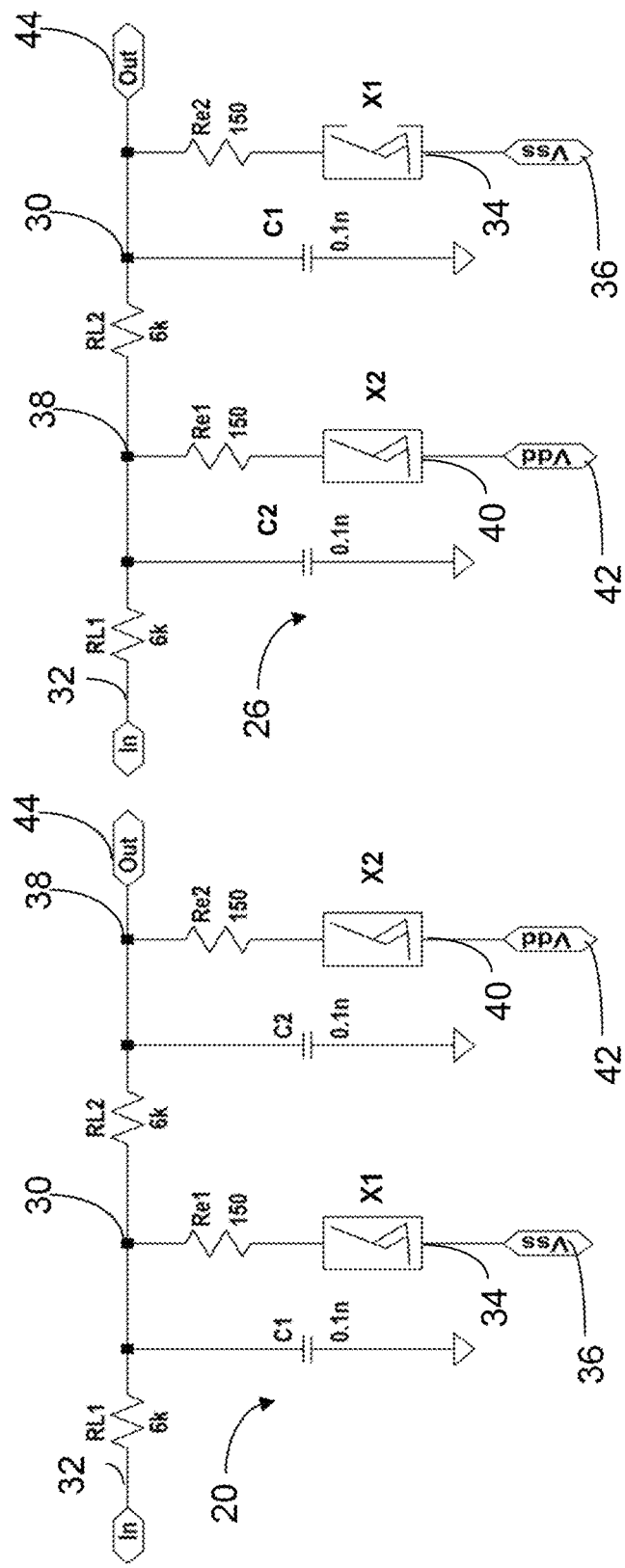
FIG. 6A shows a circuit diagram of the excitatory start trigger active memristor neuron (N1) circuit.
FIG. 6B shows a circuit diagram of the inhibitory stop trigger active memristor neuron (N2) circuit shown as functional diagrams in FIGS. 5A and 5B in accordance with the present disclosure.

FIGS. 6A and 6B are essentially the same as FIGS. 3A and 3B of Reference [7].

The circuit diagram of the self-excitatory DS cell output-counter neuron N3 18 may be identical to that shown in FIG. 6A for the excitatory start trigger neuron N1 20. As shown in FIGS. 5A and 5B a delay feedback circuit 19 is added to the output-counter neuron N3 18 and enables its capability of self-sustained spiking once triggered by the active-memristor based excitatory start trigger neuron 20, as shown in FIG. 5C.

In FIGS. 6A and 6B, X1 and X2 represent $VO_2$ active memristor devices with negative differential resistance (NDR), and Re1 and Re2 are the parasitic series resistance (150Ω is used in SPICE simulations) from the electrode wires to the $VO_2$ active memristor devices. The label In is the input port of the neuron, and the label Out is the output port of the neuron. Vdd is a positive supply voltage, and Vss is a negative supply voltage.

The SPICE model parameters for X1 and X2 vanadium dioxide ($VO_2$) devices are: deltaT=43, rch=56e-9, Lchan=100e-9, rhoIns=1e-2, rhoMet=3e-6, kappa=3.5, cp=3.3e6, deltahtr=2.35e8. More details of the excitatory and inhibitory $VO_2$ memristor neuron operations are described in Reference [7] U.S. patent application Ser. No. 15/976,687, filed May 10, 2018, which is incorporated herein by reference.

FIG. 6A shows a schematic of an excitatory active memristor neuron circuit 20, which has first (X1) and second (X2) active memristor devices that are biased with opposite polarities (−Vss 36 for X1; +Vdd 42 for X2), the first and second active memristor devices (X1, X2) being coupled to first and second grounded membrane capacitors (C1, C2).

The first active memristor device (X1) has a first node 30 connected to an input node 32 of the neuron circuit 20 by a first load resistor RL1 and a second node 34 connected to a first voltage source 36; the first node (30) of the first active memristor device (X1) being coupled to the first grounded membrane capacitor (C1). The second active memristor device (X2) has a first node 38 connected to the first node 30 of the first active memristor device X1 by a second load resistor RL2 and a second node 40 connected to a second voltage source 42; the first node 38 of the second active memristor device X2 being coupled to the second grounded membrane capacitor C2; the first node 38 of the second active memristor device X2 forming an output node 44 of the neuron circuit 20.

The first voltage source 36 is a negative voltage source and the second voltage source 42 is a positive voltage source. The voltages −Vss, +Vdd provided by voltages sources 36 and 42 can have the same amplitude or they can have different amplitudes. The direct current (d.c.) voltage supplies 36 and 42 are amplitude-matched only if the two active memristor devices X1 and X2 are well matched in their switching threshold voltages. If the switching threshold voltages of X1 and X2 are different, then the values of their d.c. voltage supplies have to be chosen differently, so that both active memristor devices are biased at the proper operating points (less than, but close to their switching threshold voltage) for the neuron circuit to spike properly.

The first and second active memristor devices X1, X2 can each comprise, between their first (respectively 30, 38) and second (respectively 34, 40) nodes, a resistance (respectively Re1, Re2) in series with an active memristor material. The active memristor material of the first and second active memristor devices X1, X2 can be a layer or thin film of vanadium dioxide ($VO_2$). Re1 can have a value of a few hundred Ohm and can be the cumulative resistance of a first metal nanowire electrode arranged between the first node (30) and a first side of the active memristor material of X1, and of a second metal nanowire electrode arranged between second node (34) and a second side of the active memristor material of X1. Similarly, Re2 can have a value of a few hundred Ohm and can be the cumulative resistance of a first metal nanowire electrode arranged between the first node (38) and a first side of the active memristor material of X2, and of a second metal nanowire electrode arranged between second node (40) and a second side of the active memristor material of X2.

A vanadium dioxide ($VO_2$) layer can generated by electroforming from a vanadium pentoxide ($V_2O_5$) layer, as detailed in U.S. patent application Ser. No. 15/417,049, (filed Jan. 26, 2017, Reference [8], above) which is incorporated by reference to this presentation.

Alternatively, the vanadium dioxide ($VO_2$) layer can be directly prepared by a variety of thin film deposition methods, including but not limited to, reactive d.c. or r.f. magnetron sputtering of vanadium metal or vanadium oxide targets, atomic layer deposition followed by post-deposition anneal, or metallic precursor oxidation.

The first and second voltage sources (36, 42) are arranged to bring the first and second active memristor devices (X1, X2) close to their respective Mott Insulator-to-Metal Transition (IMT); and the voltage biases can be adjusted to set desired levels of voltage or current threshold for the neuron action potential generation (spike firing) and desired signal gains. The first load resistor, the first active memristor device, the first voltage source and the first grounded membrane capacitor are arranged to form a first relaxation oscillator; and the second load resistor, the second active memristor device, the second voltage source and the second grounded membrane capacitor are arranged to form a second relaxation oscillator.

The active memristor material of the first and second active memristor devices X1, X2 can be a layer or thin film of vanadium dioxide ($VO_2$), where vanadium dioxide ($VO_2$) has an Mott insulator-to-metal transition (IMT) critical temperature TC close to 340 K (67° C.). The operation of such vanadium dioxide ($VO_2$) active memristor devices only requires a very moderate Joule heating to raise the local temperature by 40 K (or ° C.) above room temperature. For example, it has been calculated that an active memristor device having a vanadium dioxide ($VO_2$) channel with a 10-nm radius, has an extremely low estimated switching energy of 1.2 fJ, which is 50 times lower than a same-sized $NbO_2$ active memristor device, such as disclosed by Pickett et al. in References [9] and [10], which are incorporated herein by reference. The Inventor projects that vanadium dioxide ($VO_2$) based neuron circuits according to embodiments of this presentation are capable to achieve a biologically-competitive 0.1 pJ/spike or even less neuron energy use. A single $VO_2$ active memristor device can operate as low as 1.2 fJ, but the energy consumption of the complete neuron circuit (X1, X2, C1, C2, RL1, RL2) is dominated by the charging energy of the two membrane capacitors C1 and C2. The 0.1 pJ/spike total energy consumption is estimated assuming exemplary d.c. bias level near 0.5 V and with 40-50 fF membrane capacitors (such a small capacitor value is chosen for neuron size and spike frequency considerations).

The neuron circuit 20 can be used in a neural circuit having a plurality (not shown) of neuron circuits connected in a network (not shown); input node 32 being arranged to receive an input waveform through an input impedance Zin; and output node 44 being arranged to provide an output waveform through an output impedance Zout.

FIG. 6B shows a schematic of an inhibitory active memristor neuron circuit 26, which has first (X2) and second (X1) active memristor devices that are biased with opposite polarities (+Vdd for X2; −Vss for X1), the first and second active memristor devices (X2, X1) being coupled to first and second grounded membrane capacitors (C2, C1).

The first active memristor device (X2) has a first node 38 connected to an input node 32 of the neuron circuit 26 by a first load resistor RL2 and a second node 40 connected to a first voltage source 42; the first node 38 of the first active memristor device X2 being coupled to the first grounded membrane capacitor C2. The second active memristor device (X1) has a first node 30 connected to the first node 38 of the first active memristor device X2 by a second load resistor RL1 and a second node 34 connected to a second voltage source 36; the first node 30 of the second active memristor device X1 being coupled to the second grounded membrane capacitor C1; the first node 30 of the second active memristor device X1 forming an output node 44 of the neuron circuit 26.

The first voltage source 42 of neuron circuit 26 is a positive voltage source and the second voltage source 36 is a negative voltage source. The voltages −Vss, +Vdd provided by voltages sources 36 and 42 can have a same amplitude or they can have different amplitudes.

The first and second active memristor devices X2, X1 can each comprise, between their first (respectively 38, 30) and second (respectively 40, 34) nodes, a resistance (respectively Re2, Re1) in series with an active memristor material. The NDR material of the first and second active memristor devices X2, X1 can be a layer or thin film of vanadium dioxide, for example identical to the one detailed previously for neuron circuit 20.

Re2 can have a value of a few hundred Ohm and can be the cumulative resistance of a first metal nanowire electrode arranged between the first node (38) and a first side of the active memristor material of X2, and of a second metal nanowire electrode arranged between second node (40) and a second side of the active memristor material of X2. Similarly, Re1 can have a value of a few hundred Ohm and can be the cumulative resistance of a first metal nanowire electrode arranged between the first node (30) and a first side of the active memristor material of X1, and of a second metal nanowire electrode arranged between second node (34) and a second side of the active memristor material of X1.

The vanadium dioxide ($VO_2$) layer can be generated by electroforming from a vanadium pentoxide ($V_2O_5$) layer, as detailed in U.S. patent application Ser. No. 15/417,049, (filed Jan. 26, 2017, Reference [8], above) which is incorporated by reference to this presentation.

Alternatively, the vanadium dioxide ($VO_2$) layer can be directly prepared by a variety of thin film deposition methods, including but not limited to, reactive d.c. or r.f. magnetron sputtering of vanadium metal or vanadium oxide targets, atomic layer deposition followed by post-deposition anneal, or metallic precursor oxidation.

The first and second voltage sources (42, 36) are arranged to bring the first and second active memristor devices (X2, X1) close to their respective Mott Insulator-to-Metal Transition (IMT); and the voltage biases can be adjusted to set desired levels of voltage or current threshold for the neuron action potential generation (spike firing) and desired signal gains. The first load resistor, the first active memristor device, the first voltage source and the first grounded membrane capacitor are arranged to form a first relaxation oscillator; and the second load resistor, the second active memristor device, the second voltage source and the second grounded membrane capacitor are arranged to form a second relaxation oscillator.

Figure 1:
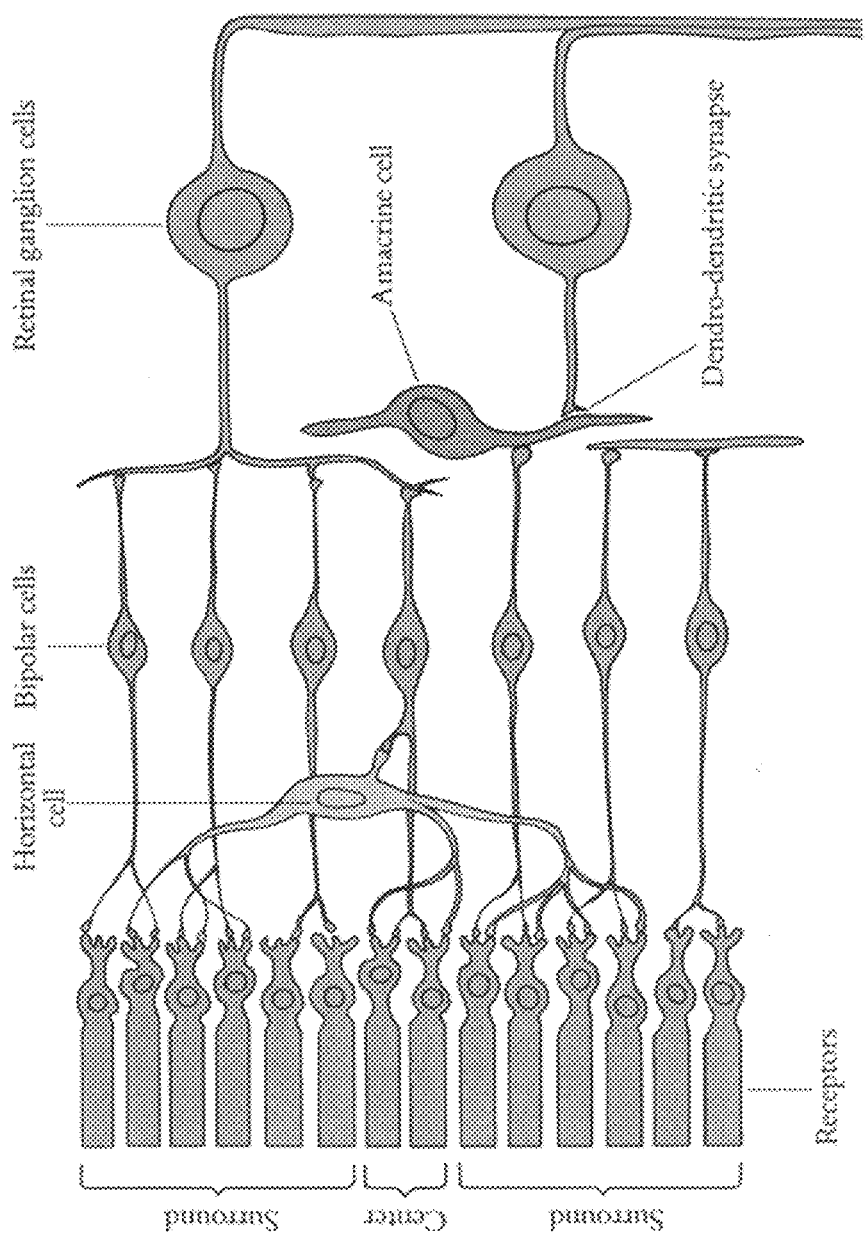
FIG. 1 shows a functional neural circuit model of an animal's retina in accordance with the prior art.

One or more of neuron circuits 20 and 26 can be used in a neural circuit having a plurality (not shown) of neuron circuits connected in a network (not shown); for example as illustrated in FIG. 1B (of Reference [7] U.S. patent application Ser. No. 15/976,687, filed May 10, 2018).

A Mott Insulator-to-Metal Transition (IMT) physics-based SPICE model of $VO_2$ active memristor devices was used to simulate the excitatory and inhibitory neuron circuits as shown in FIGS. 6A and 6B, respectively. In the SPICE model, the $VO_2$ conduction channel is modeled as a cylindrical volume with a radius of 28-56 nm and a length of 50-100 nm. These dimensions are close to experimentally observed values in electroformed $VO_2$ active memristor devices (see U.S. patent application Ser. No. 15/417,049) (filed Jan. 26, 2017, Reference [8], above) or electroform-free directly deposited $VO_2$ active memristor devices.

It is noted that the excitatory and inhibitory neuron circuits 20, 26 of FIGS. 6A and 6B are both tonic neuron circuits. According to embodiments of this presentation, and as detailed hereafter, tonic neuron circuits 20 and 26 can be made into phasic neuron circuits by replacing the input load resistor (RL1 in 20; RL2 in 26) by a capacitor or a capacitor in series with a resistor.

The delayed feedback circuit 19 sustains the spiking of the self-excitatory active memristor output neuron 18, and can be implemented by a series of multiple excitatory memristor neurons 50 daisy chained together, as shown in FIG. 7A. The input 60 of the delayed feedback circuit 19 is the output of the self-excitatory active memristor output neuron 18. The output 62 of the delayed feedback circuit 19 is connected to the input of the self-excitatory active memristor output neuron 18.

The overall delay time of such an active memristor neuron daisy chain is proportional to the number of neurons 50 in series. FIG. 7A shows the circuit diagram of an active memristor delay line element consisting of 15 stages of excitatory $VO_2$ active memristor neurons 50. FIG. 7B shows a passive resistor-capacitor filter circuit 52 with a resistor Rfilter 66 in parallel with a capacitor Cfilter 64, which is in each memristor delay line stage 53 and between each pair of excitatory $VO_2$ active memristor neurons 50. This delay line is used to provide the delayed feedback for self-sustained spiking of the output neuron N3 18. To simplify the circuit implementation, the circuit diagram as well as parameters of circuit elements for each of the VO$_2$ delay neurons 50 may be identical to that of neuron N1 20. Simulation shows that the 15-stage memristor delay line shown in FIG. 7A can provide a delay time of about 4.4 µs, which defines the period for the self-sustained spiking of output neuron N3 18.

Figure 7C:
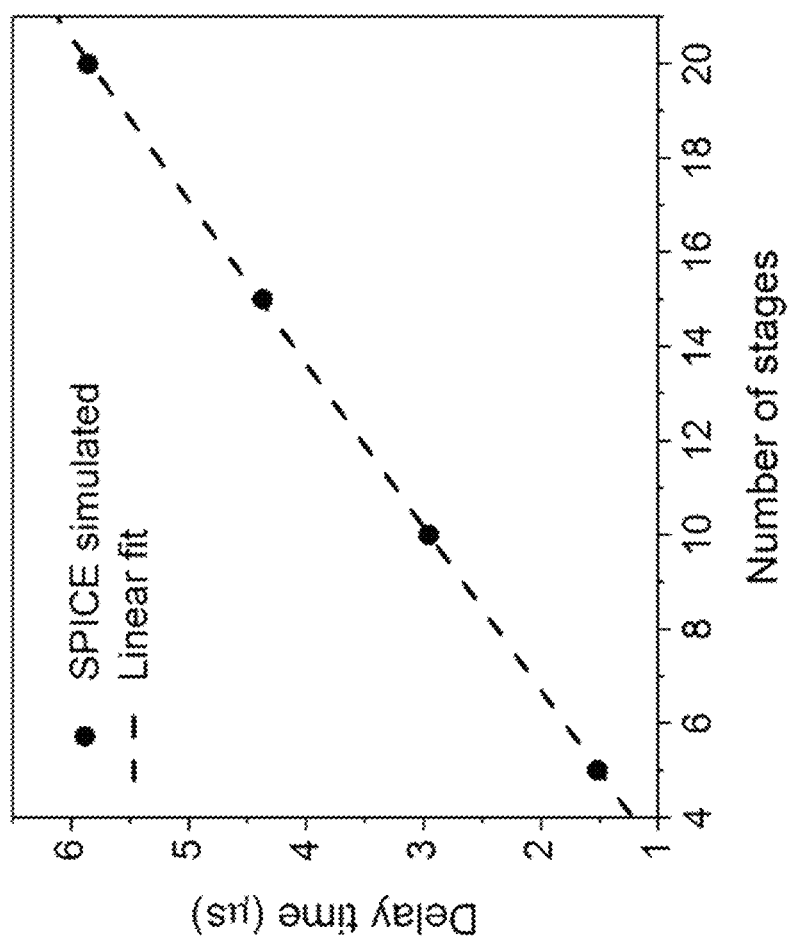
FIG. 7C shows results of a SPICE simulation of effective spike delay time versus the number of stages of excitatory active memristor neurons in the delay feedback circuit of FIG. 7A in accordance with the present disclosure.

FIG. 7C shows results of a SPICE simulation of spike delay time versus the number of VO$_2$ neuron delay stages 50. The least-square linear fit gives a relationship of: delay time (µs)=0.066+0.289×(number of stages). Accordingly a 15-stage delay line produces a delay time of 4.4 µs. The spike delay time is defined by the time interval between the onset of the input voltage pulse and the peak amplitude of the output spike. The VO$_2$ neuron parameters (RL1=RL2=6 ΩQ, Re1=Re2=150Ω, C1=C2=0.1 nF) and the RC filter parameters (Rfilter=15 ΩQ, Cfilter=0.1 nF) are the same as the values shown in the SPICE circuit schematic of FIG. 8A.

Note that the delay time for each VO$_2$ neuron stage 53 is a user-determined design parameter, which can be increased or decreased by, e.g. adjusting the membrane capacitance value of C1 as shown in FIG. 6A, for each stage. The specific circuit parameters given above and used for the simulation is just an example and other parameters may be used. A similar concept of a memristor delay line can be found in the literature, for example, in FIG. 3 in the Supplementary Information in Reference [9] by M. D. Pickett, G. Medeiros-Ribeiro and R. S. Williams, "A scalable neuristor built with Mott memristors." Nat. Mater. 12 114-117 (2013), which is incorporated herein by reference.

A passive resistor-capacitor filter circuit 52, where the resistor Rfilter 66 is in parallel with the capacitor Cfilter 64 may be used to emulate a synapse (which includes the axonal impedance in series with the synapse) between any arbitrary neighboring pair of VO$_2$ memristor neurons 50 in the memristor delay line. The axon as the output fiber of a neuron also contributes to impedance in series with the synapse junction.

FIG. 7B shows the circuit diagram of such an resistor-capacitor filter circuit 52 representing a synapse element. The resistance and capacitance values may be optimized to ensure effectively coupling between neurons while avoiding crosstalk. For the present disclosure for motion detection applications, synaptic plasticity and learning (such as a voltage-controlled synapse resistance) is not considered. In active memristor based DS circuit 10 simulations, an Rfilter 66 of 15 kΩ and a Cfilter 64 of 0.1 nF were used for all the impedance between neighboring pairs of excitatory memristor neurons 50 in the memristor delay line.

Resistor-capacitor filters may also be used to simulate synapse between excitatory memristor neurons such as resistor-capacitor filter 100 between the excitatory active memristor neuron 20 and the self-excitatory active memristor output-counter neuron 18, as shown in FIG. 8A. Again, in memristor based DS circuit 10 simulations, an Rfilter 66 of 15 kΩ and a Cfilter 64 of 0.1 nF were used for the synapses between the excitatory active memristor neuron 20 and the self-excitatory active memristor output-counter neuron 18.

As shown in the active memristor based DS circuit of FIG. 8A, the synapse between the inhibitory trigger neuron N2 26 and the self-excitatory active memristor output-counter neuron 18 may also be simulated with an output coupling filter (R//C v2) 102 using a Rfilter2 of 15 kΩ and a much smaller capacitor value of Cfilter2=10 pF, rather than the other R//C filters, which use an Cfilter=0.1 nF.

FIGS. 8A, 8B, 8C and 8D show a SPICE simulation of the active-memristor based neuromorphic DS unit circuit for the case of a stimulus moving in the preferred direction. FIG. 8A shows the circuit schematic of the directionally sensitive (DS) unit. FIG. 8B shows the input and output waveforms of the excitatory start trigger neuron N1. FIG. 8C shows the input and output waveforms of the inhibitory stop trigger neuron N2. FIG. 8D shows the input and output waveforms of the DS output-counter cell. The element labeled as "MemR Delay 15 stages" represents the 15-stage memristor neuron delay line as shown in FIG. 7A, which enables a periodic spiking of the output-counter cell with a simulated spiking period of about 4.7 µseconds.

The 4.7 µseconds spiking period in the DS output-counter cell is a result of delayed feedback using 15 stages of VO$_2$ delay neurons 50, because each stage of VO$_2$ delay neuron produces a delay of about 0.3 µseconds. The detailed sequence of the events is as follows.

The input spike sent from the start trigger cell 20 elicits the first output spike after a ~0.3 µseconds spike latency, the first output spike is fed back to the input after a 4.4 µsecond delay produced by the 15-stage delayed feedback, as shown in FIG. 7C, which elicits the second output spike after another ~0.3 µseconds spike latency. The second output spike is then fed back to the input after another 4.4 µseconds delay, which then elicits the third output spike after another ~0.3 µseconds, and so on. Consequently, the DS output counter cell produces a train of self-sustained spikes with a period=4.4 µseconds from the 15-stage delayed feedback plus 0.3 µseconds for the spike latency of the DS output-counter cell for a total of 4.7 µseconds.

To illustrate how the velocity of the moving object is detected, let's assume that the photoreceptors for the start trigger neuron N1 20 and the stop trigger neuron N2 26 are separated by a distance of dx=24 µm, and that the time difference for N1 20 and N2 26 to be triggered is five spiking periods of the output counter cell N3 18, or dt=5×4.7 µs=24 µs. The velocity of the object may then be estimated as v=dx/dt=1 m/s. This is similar to sensing by an animal retina as discussed above.

FIGS. 9A, 9B, 9C and 9D show a SPICE simulation of active-memristor based spiking neuromorphic directionally-sensitive (DS) unit for the case of a stimulus moving in the null direction. FIG. 9A shows a circuit schematic of the directionally sensitive (DS) unit, FIG. 9B shows input and output waveforms of the excitatory start trigger neuron, FIG. 9C shows input and output waveforms of the inhibitory stop trigger neuron, and FIG. 9D shows input and output waveforms of the output-counter neuron.

In this case for the stimulus moving in the null direction, no spike is generated when the DS unit (DS Unit 1) first receives an inhibitory input from the stop trigger neuron N2 26, but the output-counter neuron N3 18 will start spiking when the stimulus arrives at the excitatory start trigger neuron N1 20. To suppress this redundant spiking activity of N3 18 at the end of the time period for the stimulus to pass the receptive field, an inhibitory input 70 from the next memristor DS unit (DS Unit 2) along the direction of motion may be used to suppress the spiking activity of the output-counter neuron 18 in DS Unit 1, which is first stimulated in the null direction, as shown in FIGS. 10A and 10B. To be effective in suppressing the redundant spiking activity of N3 18, neuron N2 26 should be closely positioned to neuron N1 20 so that the excitatory spike (sent by N1 20) at the input 16 can be nullified by the inhibitory spike (sent by N2 26) at the input 70.

Figure 11:
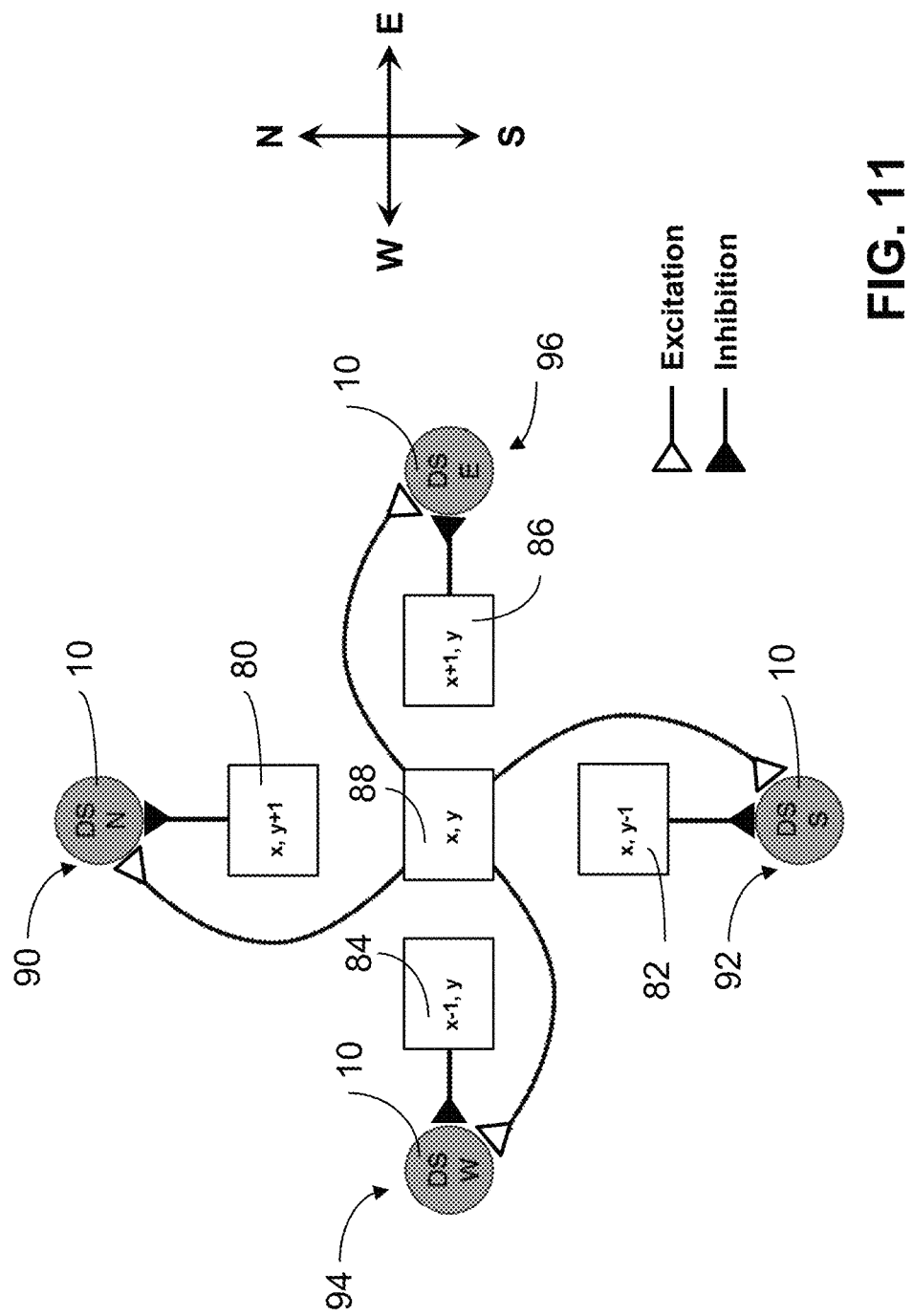
FIG. 11 shows four sets of photo-receptors and active memristor DS units arranged in the North, South, West, and East directions surrounding a central photo-receptor to allow two-dimensional (2D) direction and velocity detection of motions in accordance with the present disclosure.

FIG. 11 shows an assembly of four active memristor DS units 10 arranged to detect the direction and velocity of motion in two dimensions. There is a North DS unit 90, a South DS unit 92, a West DS unit 94, and an East DS unit 96. The designation of North, South, East and West is nominal for an arbitrary Cartesian coordinate system with orthogonal coordinate axes. Each memristor DS unit 90, 92, 94 and 96 is the same as shown in FIGS. 5A, 5B and 8A, with an excitatory active memristor start trigger neuron 20, an inhibitory active memristor stop trigger neuron 26, and a self-excitatory active memristor output-counter neuron 18 with a memristor delay feedback circuit 19. The start trigger neuron 20 and output-counter neuron 18 may be implemented by the circuit as shown in FIG. 6A, and the inhibitory stop trigger neuron 18 may be implemented by the circuit as shown in FIG. 6B. Each of the memristor DS unit is paired with a nearby photo-receptor. There is a North photo-receptor 80 connecting to 90, a South photo-receptor 82 connecting to 92, a West photo-receptor 84 connecting to 94, and an East photo-receptor 86 connecting to 96. A photo-receptor 88, located at the center, connects to all the four DS units 90, 92, 94, and 96. Note that the photo-receptors can be placed on a different physical surface than the memristor DS units, for example on top of them, in a similar fashion as animal retina conceptually shown in FIG. 1.

To the north of the center photo-receptor 88 is photo-receptor 80, which together with the photo-receptor 88 is connected to the North DS unit 90. Photo-receptor 88 is connected to the excitatory start trigger neuron 20 in the North DS unit 90, and the photo-receptor 80 is connected to the inhibitory stop trigger neuron 26 in the North DS unit 90 to sense a northward motion.

To the south of the center photo-receptor 88 is photo-receptor 82, which together with the photo-receptor 88 is connected to the South DS unit 92. Photo-receptor 88 is connected to the excitatory start trigger neuron 20 in the South DS unit 92, and the photo-receptor 82 is connected to the inhibitory stop trigger neuron 26 in the South DS unit 92 to sense a southward motion.

To the west of the center photo-receptor 88 is photo-receptor 84, which together with the photo-receptor 88 is connected to the West DS unit 94. Photo-receptor 88 is connected to the excitatory start trigger neuron 20 in the West DS unit 94, and the photo-receptor 84 is connected to the inhibitory stop trigger neuron 26 in the West DS unit 94 to sense a westward motion.

To the east of the center photo-receptor 88 is photo-receptor 86, which together with the photo-receptor 88 is connected to the East DS unit 96. Photo-receptor 88 is connected to the excitatory start trigger neuron 20 in the East DS unit 96, and the photo-receptor 86 is connected to the inhibitory stop trigger neuron 26 in the East DS unit 96 to sense an eastward motion.

The two dimensional DS units in FIG. 11 can be repeated in an array to form a memristor based artificial retina.

Reference [11] describes a two-dimensional motion detector implemented in CMOS. However, as described above, a CMOS implementation lacks the benefits of scalability and energy efficiency of the active-memristor implementation of the present disclosure.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A motion-sensing circuit for determining a direction of motion and a velocity of an object comprising:
   a first photo-receptor for sensing the object;
   an excitatory active memristor neuron circuit coupled to the first photo-receptor;
   a second photo-receptor for sensing the object;
   an inhibitory active memristor neuron circuit coupled to the second photo-receptor; and
   a self-excitatory active memristor output-counter neuron circuit coupled to the excitatory active memristor neuron circuit and coupled to the inhibitory active memristor neuron circuit.

2. The motion-sensing circuit of claim 1:
   wherein if the first photo-receptor senses the object, then the excitatory active memristor neuron circuit sends an excitatory spike to the self-excitatory active memristor output-counter neuron circuit;
   wherein the self-excitatory active memristor output-counter neuron circuit outputs periodic spikes upon receiving the excitatory pulse;
   wherein if the second photo-receptor senses the object, then the inhibitory active memristor neuron circuit sends an inhibitory spike to the self-excitatory active memristor output-counter neuron circuit; and
   wherein the self-excitatory active memristor output-counter neuron circuit ceases to output spikes upon receiving the inhibitory pulse.

3. The motion-sensing circuit of claim 1 wherein the self-excitatory active memristor output-counter neuron circuit comprises:
   an excitatory active memristor neuron circuit having an output; and
   a delay feedback circuit having an input coupled to an output of the active memristor neuron circuit, and having an output coupled to the input of the excitatory active memristor neuron circuit.

4. The motion-sensing circuit of claim 3 wherein the delay feedback circuit comprises:
a plurality of memristor delay line elements daisy chained in series;
wherein each of the memristor delay line elements comprises:
an excitatory active memristor neuron circuit; and
a resistor-capacitor filter circuit coupled to the excitatory active memristor neuron circuit, the resistor-capacitor filter circuit comprising a resistor and a capacitor connected in parallel with the resistor.

5. The motion-sensing circuit of claim 2:
wherein if the excitatory spike is generated before the inhibitory spike, then the direction of the motion of the object is from the first photo-receptor towards the second photo-receptor.

6. The motion-sensing circuit of claim 2:
wherein if the inhibitory spike is generated before the excitatory spike, then the direction of the motion of the object is from the second photo-receptor towards the first photo-receptor.

7. The motion-sensing circuit of claim 2:
wherein the velocity of the object is derived by dividing a distance between the first photo-receptor and the second photo-receptor by a time interval between the beginning and the end of the periodic spikes generated by the output-counter neuron.

8. The motion-sensing circuit of claim 2 further comprising:
at least a third photo-receptor for sensing the object, the third photo-receptor aligned with the first and second photo-receptors;
a second excitatory active memristor neuron circuit coupled to the third photo-receptor;
at least a fourth photo-receptor for sensing the object, the fourth photo-receptor aligned with the first, second and third photo-receptors and adjacent the first photo-receptor;
a second inhibitory active memristor neuron circuit coupled to the fourth photo-receptor; and
a second self-excitatory active memristor output-counter neuron circuit coupled to the second excitatory active memristor neuron circuit and coupled to the second inhibitory active memristor neuron circuit;
wherein if the inhibitory spike from the inhibitory active memristor neuron circuit is before the excitatory spike from the excitatory active memristor neuron circuit then the direction of the motion of the object is from the second photo-receptor towards the first photo-receptor, and the self-excitatory active memristor output-counter neuron circuit begins to output periodic spikes upon receiving the excitatory pulse from the excitatory active memristor neuron circuit; and
wherein if the fourth photo-receptor senses the object, then the second inhibitory active memristor neuron circuit sends an inhibitive stop spike to the self-excitatory active memristor output-counter neuron circuit and the first self-excitatory active memristor output-counter neuron circuit ceases to output spikes upon receiving the inhibitory stop spike.

9. The motion-sensing circuit of claim 1 wherein the excitatory active memristor neuron circuit and the self-excitatory active memristor output-counter neuron circuit each comprise:
a first active memristor device biased with a first voltage source;
a second active memristor device biased with a second voltage source, wherein the first voltage source and the second voltage source are opposite polarities;
a first capacitor coupled to ground and coupled to a first node of the first active memristor device;
a first load resistor coupled between an input node of the excitatory active memristor neuron circuit or the self-excitatory active memristor output-counter neuron circuit and the first capacitor;
a second capacitor coupled to ground; and
a second load resistor coupled between the first capacitor and the second capacitor, and coupled to a first node of the second active memristor device;
wherein the first node of the second active memristor device forms an output node of the excitatory active memristor neuron circuit or the self-excitatory active memristor output-counter neuron circuit;
wherein the first voltage source is a negative voltage source; and
wherein the second voltage source is a positive voltage source.

10. The motion-sensing circuit of claim 9 further comprising:
a third load resistor coupled between the first capacitor and the first node of the first active memristor device; and
a fourth load resistor coupled between the second capacitor and a first node of the second active memristor device.

11. The motion-sensing circuit of claim 9 wherein:
at least one of the first and second active memristor devices comprises a vanadium dioxide layer.

12. The motion-sensing circuit of claim 9 wherein:
the first and second voltage sources are configured to bring the first and second active memristor devices close to their respective Mott insulator-to-metal transition.

13. The motion-sensing circuit of claim 1 wherein the inhibitory active memristor neuron circuit comprises:
a first active memristor device biased with a first voltage source;
a second active memristor device biased with a second voltage source, wherein the first voltage source and the second voltage source are opposite polarities;
a first capacitor coupled to ground and coupled to a first node of the first active memristor device;
a first load resistor coupled between an input node of the inhibitory active memristor neuron circuit and the first capacitor;
a second capacitor coupled to ground; and
a second load resistor coupled between the first capacitor and the second capacitor, and coupled to a first node of the second active memristor device;
wherein the first node of the second active memristor device forms an output node of the inhibitory active memristor neuron circuit;
wherein the first voltage source is a positive voltage source; and
wherein the second voltage source is a negative voltage source.

14. The motion-sensing circuit of claim 13 further comprising:
a third load resistor coupled between the first capacitor and the first node of the first active memristor device; and a fourth load resistor coupled between the second capacitor and a first node of the second active memristor device.

15. The motion-sensing circuit of claim 13 wherein:
at least one of the first and second active memristor devices comprises a vanadium dioxide layer.

16. The motion-sensing circuit of claim 13 wherein:
the first and second voltage sources are configured to bring the first and second active memristor devices close to their respective Mott insulator-to-metal transition.

17. A method for determining a direction of motion and a velocity of an object comprising:
providing a first photo-receptor for sensing the object;
providing an excitatory active memristor neuron circuit coupled to the first photo-receptor;
providing a second photo-receptor for sensing the object;
providing an inhibitory active memristor neuron circuit coupled to the second photo-receptor;
providing a self-excitatory active memristor output-counter neuron circuit coupled to the excitatory active memristor neuron circuit and coupled to the inhibitory active memristor neuron circuit;
sending an excitatory pulse from the excitatory active memristor neuron circuit to the self-excitatory active memristor output-counter neuron circuit if the first photo-receptor senses the object, wherein the self-excitatory active memristor output-counter neuron circuit outputs pulses at a periodic rate upon receiving the excitatory pulse; and
sending an inhibitory pulse from the inhibitory active memristor neuron circuit to the self-excitatory active memristor output-counter neuron circuit if the second photo-receptor senses the object, wherein the self-excitatory active memristor output-counter neuron circuit ceases to output pulses upon receiving the inhibitory pulse.

18. The method of claim 17 wherein the self-excitatory active memristor output-counter neuron circuit comprises:
a second excitatory active memristor neuron circuit having an output; and
a delay feedback circuit having an input coupled to an output of the second active memristor neuron circuit, and having an output coupled to the second excitatory active memristor neuron circuit.

19. The method of claim 17 further comprising:
dividing a distance between the first photo-receptor and the second photo-receptor by a time between the excitatory pulse and the inhibitory pulse to determine the velocity of the object.

20. The method of claim 17 wherein the excitatory active memristor neuron circuit and the self-excitatory active memristor output-counter neuron circuit each comprise:
a first active memristor device biased with a first voltage source;
a second active memristor device biased with a second voltage source, wherein the first voltage source and the second voltage source are opposite polarities;
a first capacitor coupled to ground and coupled to a first node of the first active memristor device;
a first load resistor coupled between an input node of the excitatory active memristor neuron circuit or the self-excitatory active memristor output-counter neuron circuit and the first capacitor;
a second capacitor coupled to ground; and a second load resistor coupled between the first capacitor and the second capacitor, and coupled to a first node of the second active memristor device;
wherein the first node of the second active memristor device forms an output node of the excitatory active memristor neuron circuit or the self-excitatory active memristor output-counter neuron circuit;
wherein the first voltage source is a negative voltage source; and
wherein the second voltage source is a positive voltage source.

21. The method of claim 20 wherein:
at least one of the first and second active memristor devices comprises a vanadium dioxide layer.

22. The method of claim 20 wherein:
the first and second voltage sources are configured to bring the first and second active memristor devices close to their respective Mott insulator-to-metal transition.

23. The method of claim 17 wherein the inhibitory active memristor neuron circuit comprises:
a first active memristor device biased with a first voltage source;
a second active memristor device biased with a second voltage source, wherein the first voltage source and the second voltage source are opposite polarities;
a first capacitor coupled to ground and coupled to a first node of the first active memristor device;
a first load resistor coupled between an input node of the inhibitory active memristor neuron circuit and the first capacitor;
a second capacitor coupled to ground; and
a second load resistor coupled between the first capacitor and the second capacitor, and coupled to a first node of the second active memristor device;
wherein the first node of the second active memristor device forms an output node of the inhibitory active memristor neuron circuit;
wherein the first voltage source is a positive voltage source; and
wherein the second voltage source is a negative voltage source.

24. The method of claim 23 wherein:
at least one of the first and second active memristor devices comprises a vanadium dioxide layer.

25. The method of claim 23 wherein:
the first and second voltage sources are configured to bring the first and second active memristor devices close to their respective Mott insulator-to-metal transition.

26. A motion-sensing circuit for determining a two dimensional direction of motion and velocity of an object comprising:
a first photo-receptor for sensing the object located in a center position;
a second photo-receptor for sensing the object located above the first photo-receptor;
a third photo-receptor for sensing the object located below the first photo-receptor;
a fourth photo-receptor for sensing the object located to a left of the first photo-receptor;
a fifth photo-receptor for sensing the object to a right of the first photo-receptor;
a first direction sensitive device located above the second photo-receptor and coupled to the first photo-receptor and the second photo-receptor;

a second direction sensitive device located below the third photo-receptor and coupled to the first photo-receptor and the third photo-receptor;

a third direction sensitive device located to the left of the fourth photo-receptor and coupled to the first photo-receptor and the fourth photo-receptor; and a fourth direction sensitive device located to the right of the fifth photo-receptor and coupled to the first photo-receptor and the fifth photo-receptor;

wherein the first, second, third and fourth direction sensitive devices each comprise:

an excitatory active memristor neuron circuit;

an inhibitory active memristor neuron circuit; and a self-excitatory active memristor output-counter neuron circuit coupled to the excitatory active memristor neuron circuit and coupled to the inhibitory active memristor neuron circuit.

27. The motion-sensing circuit of claim 26 wherein to detect an upward motion:

the excitatory active memristor neuron circuit in the first direction sensitive device is coupled to the first photo-detector; and the inhibitory active memristor neuron circuit in the first direction sensitive device is coupled to the second photo-detector.

28. The motion-sensing circuit of claim 26 wherein to detect a downward motion:

the excitatory active memristor neuron circuit in the second direction sensitive device is coupled to the first photo-detector; and the inhibitory active memristor neuron circuit in the second direction sensitive device is coupled to the third photo-detector.

29. The motion-sensing circuit of claim 26 wherein to detect a motion to the left:

the excitatory active memristor neuron circuit in the third direction sensitive device is coupled to the first photo-detector; and the inhibitory active memristor neuron circuit in the third direction sensitive device is coupled to the fourth photo-detector.

30. The motion-sensing circuit of claim 26 wherein to detect a motion to the right:

the excitatory active memristor neuron circuit in the fourth direction sensitive device is coupled to the first photo-detector; and the inhibitory active memristor neuron circuit in the fourth direction sensitive device is coupled to the fifth photo-detector.

31. The motion-sensing circuit of claim 26 wherein the excitatory active memristor neuron circuit and the self-excitatory active memristor output-counter neuron circuit each comprise:

a first active memristor device biased with a first voltage source;

a second active memristor device biased with a second voltage source, wherein the first voltage source and the second voltage source are opposite polarities;

a first capacitor coupled to ground and coupled to a first node of the first active memristor device;

a first load resistor coupled between an input node of the excitatory active memristor neuron circuit or the self-excitatory active memristor output-counter neuron circuit and the first capacitor;

a second capacitor coupled to ground; and a second load resistor coupled between the first capacitor and the second capacitor, and coupled to a first node of the second active memristor device;

wherein the first node of the second active memristor device forms an output node of the excitatory active memristor neuron circuit or the self-excitatory active memristor output-counter neuron circuit;

wherein the first voltage source is a negative voltage source; and wherein the second voltage source is a positive voltage source.

32. The motion-sensing circuit of claim 26 wherein the inhibitory active memristor neuron circuit comprises:

a first active memristor device biased with a first voltage source;

a second active memristor device biased with a second voltage source, wherein the first voltage source and the second voltage source are opposite polarities;

a first capacitor coupled to ground and coupled to a first node of the first active memristor device;

a first load resistor coupled between an input node of the inhibitory active memristor neuron circuit and the first capacitor;

a second capacitor coupled to ground; and a second load resistor coupled between the first capacitor and the second capacitor, and coupled to a first node of the second active memristor device;

wherein the first node of the second active memristor device forms an output node of the inhibitory active memristor neuron circuit;

wherein the first voltage source is a positive voltage source; and wherein the second voltage source is a negative voltage source.

* * * * *